US008144447B2

(12) United States Patent
Oura et al.

(10) Patent No.: US 8,144,447 B2
(45) Date of Patent: Mar. 27, 2012

(54) ELECTROMAGNETIC LOAD CONTROLLER

(75) Inventors: Ryoichi Oura, Hitachinaka (JP); Mitsuhiko Watanabe, Odawara (JP); Takuya Mayuzumi, Hitachinaka (JP); Kaneyuki Okamoto, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 540 days.

(21) Appl. No.: 12/355,252

(22) Filed: Jan. 16, 2009

(65) Prior Publication Data

US 2009/0184576 A1 Jul. 23, 2009

(30) Foreign Application Priority Data

Jan. 22, 2008 (JP) ................................ 2008-011584

(51) Int. Cl.
*H03K 3/00* (2006.01)
*G01R 31/02* (2006.01)

(52) U.S. Cl. ......... 361/143; 361/139; 361/146; 361/152

(58) Field of Classification Search .................. 361/143, 361/139, 146, 152
See application file for complete search history.

(56) References Cited

U.S. PATENT DOCUMENTS

| | | | | |
|---|---|---|---|---|
| 3,736,495 | A * | 5/1973 | Calkin et al. | 323/286 |
| 4,554,489 | A * | 11/1985 | McKibben | 315/399 |
| 5,304,935 | A * | 4/1994 | Rathke et al. | 324/415 |
| 5,313,923 | A * | 5/1994 | Takeuchi et al. | 123/497 |
| 6,069,372 | A * | 5/2000 | Uenishi | 257/139 |
| 6,738,239 | B2 * | 5/2004 | Petruska | 361/23 |
| 7,365,584 | B2 * | 4/2008 | Bennett et al. | 327/170 |
| 7,847,604 | B2 * | 12/2010 | Fuma et al. | 327/108 |

FOREIGN PATENT DOCUMENTS

| | | | |
|---|---|---|---|
| JP | 61-277844 | A | 12/1986 |
| JP | 10-159624 | A | 6/1998 |
| JP | 2000-269029 | * | 3/1999 |
| JP | 2001-234793 | A | 8/2001 |
| JP | 3871168 | B2 | 10/2006 |

OTHER PUBLICATIONS

Japanese Office Action with English translation dated Apr. 27, 2010 (Eight (8) pages).

* cited by examiner

*Primary Examiner* — Rexford Barnie
*Assistant Examiner* — Zeev V Kitov
(74) *Attorney, Agent, or Firm* — Crowell & Moring LLP

(57) ABSTRACT

An internal combustion engine controller comprises a current or voltage source for controlling a potential at a diagnosis position in order to ensure a high-precision fault diagnosis, even if the drive cycle of the electromagnetic load (such as a fuel injector), in the internal combustion engine is shorted. Diagnosis timing is optimally set or the number of determinations for averaging is increased in order to ensure high-precision fault diagnosis without being influenced by unexpected disturbance such as noises. In fault diagnosis of a regeneration circuit into a booster circuit, either an input/output voltage or the regeneration current of a driver of the electromagnetic load is detected.

11 Claims, 15 Drawing Sheets

ELECTROMAGNETIC LOAD CONTROLLER

CLAIM OF PRIORITY

The present application claims priority from Japanese Patent Application JP 2008-011584 filed on Jan. 22, 2008, the content of which is hereby incorporated by reference into this application.

FIELD OF THE INVENTION

The present invention relates to internal combustion engine controllers for automobiles, motorcycles, farm vehicles, industrial machines, or ships which use gasoline or light oil as fuel. More particularly, the present invention relates to electromagnetic load controllers, such as fuel injectors, which are driven by a battery voltage or a boosted battery voltage, and driving and fault diagnosis of the controllers.

BACKGROUND OF THE INVENTION

The internal combustion engine controllers for automobiles, motorcycles, farm vehicles, industrial machines, or ships which use gasoline or light oil as fuel are equipped with an injector (fuel injector) that injects fuel directly into cylinders to improve fuel consumption and engine output. Such a direct fuel injector uses high-pressure fuel and therefore requires a large amount of energy for valve opening operation. The direct fuel injector also requires having a short time for the energy to be supplied and interrupted in order to respond to an improvement in control performance (response) and to a high-speed rotation (high-speed control). That is, it is necessary to interrupt a current flowing in an electromagnetic load in a short time. Japanese Patent No. 3871168 discloses a conventional internal combustion engine controller that controls fuel injection.

In order to interrupt the current in the electromagnetic load in a short time and rapidly remove (consume) the large amount of energy from the electromagnetic load, a system has been proposed, for example, which transforms the energy into a heat energy using the Zener diode effect in a drive circuit. JP-A-2001-234793 discloses another system which regenerates the energy stored in the electromagnetic load into a booster circuit. The latter system may regenerate the energy using a regeneration element such as a regeneration diode. This system is widely utilized in direct-injection engines using gasoline as fuel because the system can relatively reduce heat generation in the drive circuit where a large current flows.

If some fault, such as battery short (short circuit to battery), ground short (short circuit to ground), short circuit to high-side driver, or open state, occurs in the electromagnetic load during driving or interrupting of the electromagnetic load, it is necessary to detect and diagnose the fault immediately. However, in a case of short drive cycle (that is, when the rotating speed of the internal combustion engine increases), the conventional internal combustion engine controllers cannot set a fault-detection timing control properly, and a diagnosis circuit may misdiagnose that short-circuit to a battery has occurred, for example, although the drive circuit and the electromagnetic load are normal. Moreover, an improvement in controllability may fail because it takes long time to return the potential of a diagnosis position to an initial state. In addition, the diagnosis circuit may misdiagnose due to unexpected disturbance such as noises.

Besides, if the regeneration element breaks down by overload energy, the energy cannot be regenerated, resulting in a possible serious accident, such as heat generation or ignition of the device.

An object of the present invention is to provide an internal combustion engine controller that drives an electromagnetic load such as an injector (fuel injector), improving a fault diagnosis precision of the electromagnetic load and stabilizing a high-speed control even when the rotating speed of an internal combustion engine becomes higher, that is, when the drive cycle of the electromagnetic load becomes shorter.

Another object of the present invention is to provide an internal combustion engine controller that is not influenced by noises.

Still another object of the present invention is to provide an internal combustion engine controller having a booster circuit of a battery voltage, with high reliability in fault diagnosis for a circuit that regenerates counter electromotive energy into the booster circuit as the counter electromotive energy is generated in driving of the electromagnetic load.

SUMMARY OF THE INVENTION

The present invention has a feature that a current source or a voltage source is provided for controlling a potential of the diagnosis position in order to ensure a high-precision fault diagnosis even if the drive cycle of the electromagnetic load, such as the fuel injector, in the internal combustion engine is shortened. The present invention also has a feature that diagnosis timing is optimally set or the number of determinations for averaging is increased in order to ensure the high-precision fault diagnosis without being influenced by unexpected disturbance such as noises.

In the fault diagnosis of the regeneration circuit into the booster circuit, the above object can be achieved by detecting an input/output voltage or the regeneration current of a driver (switching element) of the electromagnetic load.

More specifically, the electromagnetic load controller according to the present invention is basically configured as follows.

The electromagnetic load controller comprises an electromagnetic load; a power supply for the electromagnetic load; a driver for the electromagnetic load, disposed at either or both of between the power supply and the electromagnetic load and between the electromagnetic load and the ground; a switching element for the driver; diagnosing means for diagnosing a fault of a circuit configuration by detecting a voltage abnormality between the electromagnetic load and the switching element; and at least one of means for rapidly attenuating a counter electromotive energy that is generated at the time of an interruption of the electromagnetic load, means for setting a time zone for detecting the voltage abnormality, and means for confirming the voltage abnormality.

The internal combustion engine controller that drives the electromagnetic load can ensure the reliability and precision of the fault diagnosis of the electromagnetic load even when the drive cycle of the internal combustion engine becomes shorter. In addition, the high-precision fault diagnosis can be ensured without being influenced by the noises. Further, more improvement in safety can be expected because of the reliable fault diagnosis of the circuit that regenerates the counter electromotive energy into the booster circuit.

DETAILED DESCRIPTION OF THE PREFERRED EMBODIMENTS

A description will be given below of embodiments of an internal combustion engine controller in accordance with the present invention with reference to the accompanying drawings.

First Embodiment

An internal combustion engine controller in accordance with a first embodiment of the present invention will be described with reference to FIGS. 1 and 3.

Figure 1:
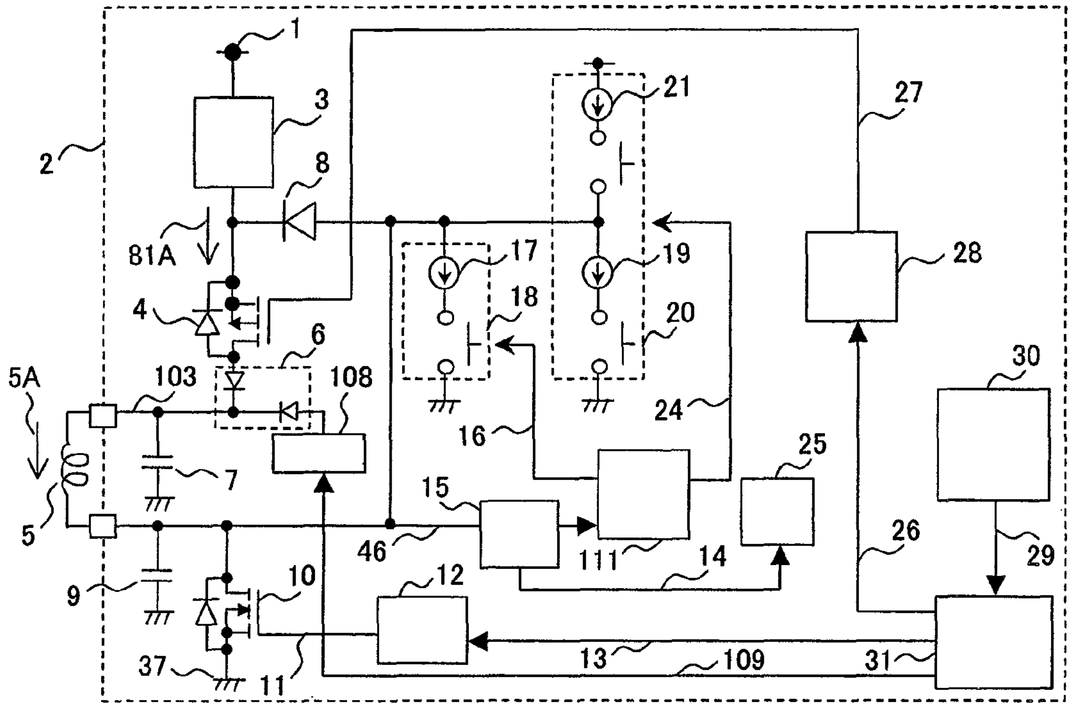
FIG. 1 is a circuit configuration diagram of an internal combustion engine controller in accordance with a first embodiment of the present invention.

FIG. 1 shows a circuit configuration of an internal combustion engine controller 2 which includes a battery voltage 1, a booster circuit 3 that boosts the battery voltage 1, and an electromagnetic load 5 that is located between the booster circuit 3 and a ground 37.

The internal combustion engine controller 2 also includes a high-side driver 4 between the battery voltage 1 and the electromagnetic load 5, and a low-side driver 10 between the ground 37 and the electromagnetic load 5. The high-side driver 4 and the low-side driver 10 are drivers for the electromagnetic load 5, and comprise switching elements (for example, FETs) As used herein, "high side (upper or upstream side)" and "low side (lower or downstream side)" means, respectively, the battery voltage 1 side and the ground 37 side in relation to the electromagnetic load 5.

The internal combustion engine controller 2 further includes a microprocessor 30, a logical circuit 31, a drive signal generator for high-side driver 28, and a drive signal generator for low-side driver 12. The internal combustion engine controller 2 also includes a voltage detector 15 and a diagnosis circuit 25 for diagnosing a fault of the electromagnetic load 5.

The booster circuit 3 boosts a battery voltage 1, and the boosted voltage is applied to the electromagnetic load 5 through the high-side driver 4 and the low-side driver 10. An electromagnetic load current 5A that flows through the electromagnetic load 5, such as an injector, increases in a short time by the boosted voltage. In this way, the internal combustion engine controller 2 drives the high-side driver 4 and the low-side driver 10 to drive the electromagnetic load 5. This process will be described below. A control signal 29 is output from the microprocessor 30 and input to the logical circuit 31. On the basis of the control signal 29, the logical circuit 31 outputs a logical drive signal for high-side driver 26 and a first logical drive signal for low-side driver 13 to a drive signal generator for high-side driver 28 and a drive signal generator for low-side driver 12, respectively. The drive signal generators 28 and 12 generate an analog drive signal for high-side driver 27 and an analog drive signal for low-side driver 11 on the basis of the input logical signals 26 and 13. The analog drive signals 27 and 11 energize the high-side driver 4 and the low-side driver 10, allowing the electromagnetic load current 5A to flow in the electromagnetic load 5, which then gets to drive.

The electromagnetic load current 5A is relatively large enough to drive a valving element (for example, to open a valve) of the electromagnetic load 5, such as an injector, with a good response. After the electromagnetic load 5 is driven, an amount of current which continuously maintains the state of the driven valving element is supplied to the electromagnetic load 5 for a given period of time. In this case, the state of the driven electromagnetic load 5 is maintained with the drive signal for low-side driver 11 kept on (that is, the low-side driver 10 is on), the drive signal for high-side driver 27 kept off (the high-side driver 4 is off), and the electromagnetic load 5 chopped by a chopping signal generator 108. A chopping signal 109 is output from the logical circuit 31 according to the control signal 29 from the microprocessor 30. The details will be described later with reference to FIG. 3.

The fault diagnosis of the electromagnetic load 5 is performed by the diagnosis circuit 25. The voltage detector 15 detects a drain voltage 46 of the low-side driver 10, and outputs a diagnosis flag signal 14 to the diagnosis circuit 25.

For example, if the drain voltage 46 of the low-side driver 10 increases close to the battery voltage 1 and exceeds a threshold of battery short, the diagnosis circuit 25 determines that the electromagnetic load 5 is short-circuited to battery.

On the other hand, if the drain voltage 46 of the low-side driver 10 decreases close to the voltage of the ground level and falls below a threshold of ground short, the diagnosis circuit 25 determines that the electromagnetic load 5 is short-circuited to ground.

The internal combustion engine controller 2 further includes a first current source controller 18, a second current source controller 20, and a drive signal selector for current control 111. The first current source controller 18 includes a first current source 17. The second current source controller 20 includes a second current source 19 and a third current source 21. The drive signal selector 111 selectively switches and controls the current sources 17, 19, and 21 of the first and second current source controllers 18 and 20, respectively, according to an output signal from the drain voltage detector 15.

The second current source controller 20 detects the drain voltage of the electromagnetic load 5 on the switching element (low-side driver 10) side, and keeps the drain voltage at a given voltage level when the electromagnetic load 5 is driving. For example, if the drain voltage is low, the third current source 21 (current source at the power supply side) is turned on by the drain voltage detector 15 and the drive signal selector for current control 111 to increase the drain voltage. If the drain voltage is high, the second current source 19 (current source at the ground side) is turned on to decrease the drain voltage. In this way, the second current source controller 20 keeps the drain voltage at a given level. The second current source 19 is connected to the ground side in this case, resulting in a gradual decrease of the drain voltage to converge at the given level.

Figure 19:
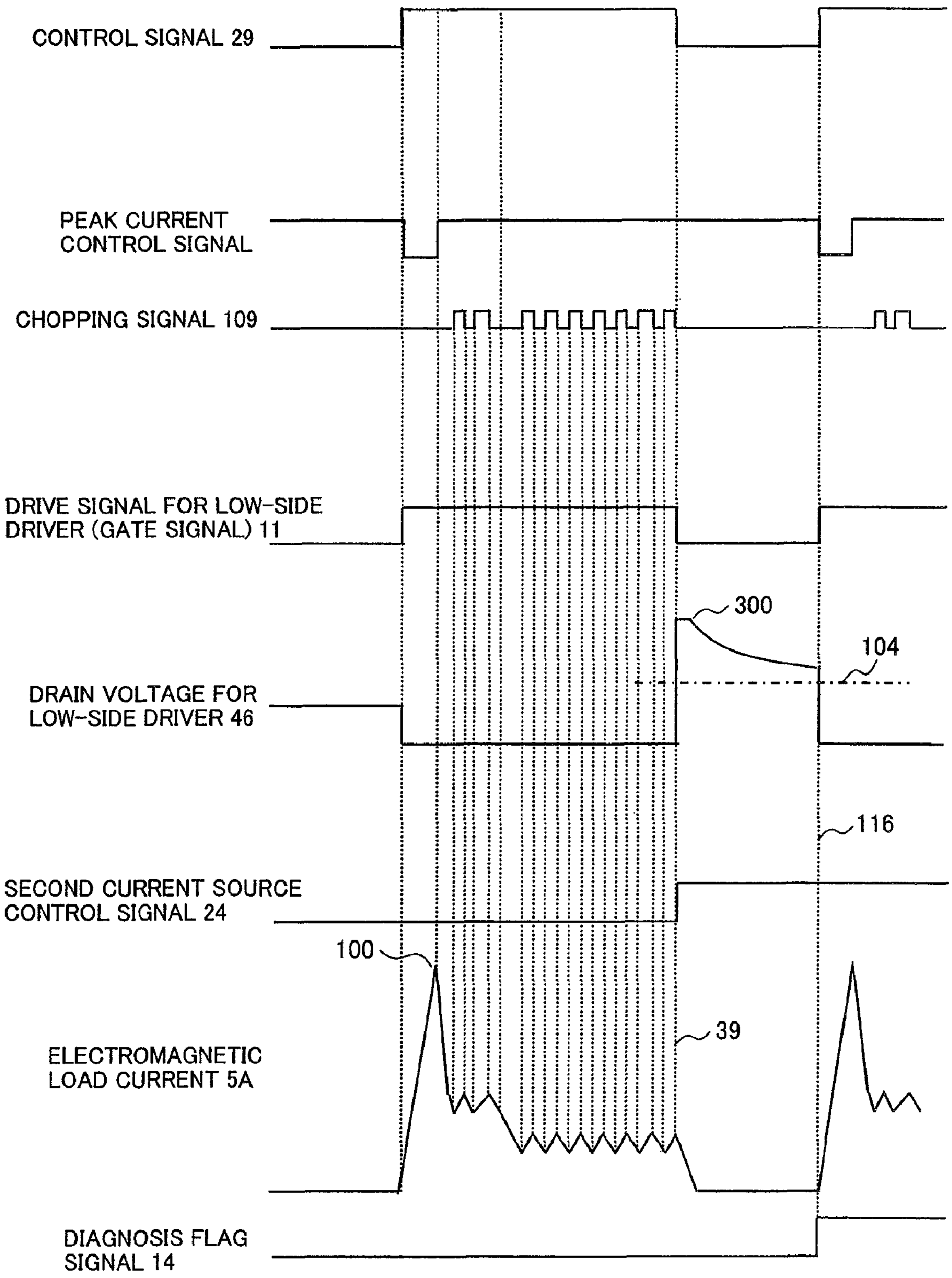
FIG. 19 shows an example of an operating waveform of a circuit in the internal combustion engine controller without the first current-source controller in the first embodiment.

The first current source 17, which is included in the first current source controller 18, rapidly attenuates a jumping voltage caused by a counter electromotive energy generated at the drain side of the low-side driver 10. The counter electromotive energy is generated by the electromagnetic load 5 when current through the electromagnetic load 5 is interrupted (that is, when the electromagnetic load 5 stops driving or when high-side and low-side drivers 4 and 10 turn off). The rapid attenuation of the counter electromotive energy prevents misdiagnoses of battery short at timing when the voltage detector 15 detects the battery short or the ground short. The battery short and the ground short are detected when the control signal 29 from the microprocessor 30 rises, that is, when the electromagnetic load 5 starts driving (when the high-side and low-side drivers 4 and 10 turn on). The details will be described below with reference to timing charts in FIGS. 3 and 19.

The first current source 17, which is included in the first current source controller 18, is disposed between the drain side of the low-side driver 10 and the ground as with the second current source 19 included in the second current source controller 20. A difference of the second current source 19 and the first current source 17 is that the second current source 19 is a sink current source for convergence which converges the drain voltage at a given level whereas the first current source 17 rapidly attenuates a counter electromotive energy (rapidly attenuates a first counter drain voltage). As a result, the second current source 19 and the first current source 17 are different in the characteristics.

The internal combustion engine controller 2 is equipped with an upper capacitor of electromagnetic load for noise or surge 7 and a lower capacitor of electromagnetic load for noise or surge 9 in order to protect the input and output signal of the electromagnetic load 5 from disturbance, such as surge or noise from the external.

The internal combustion engine controller 2 further comprises a rectification diode 6 and a regeneration diode 8. The rectification diode 6 prevents a backflow of current when the electromagnetic load 5 is chopped. The regeneration diode 8 regenerates a current generated by a counter electromotive energy of the low-side driver 10 into the booster circuit 3 when the analog drive signal for low-side driver 11 turns off at the falling edge of the control signal 29.

The operation of the internal combustion engine controller in accordance with a first embodiment will be described with reference to timing charts shown in FIG. 3.

When the control signal 29 output from the microprocessor 30 turns on, the drive signals of the low-side driver 10 and the high-side driver 4 (that is, the analog drive signal for low-side driver 11 and the analog drive signal for high-side driver 27) turn on and the electromagnetic load current 5A flows through the electromagnetic load 5.

The battery voltage 1 boosted by the booster circuit 3 increases the electromagnetic load current 5A in a short time up to a threshold of peak current 100 during a peak-current flow period in an initial energization stage. The electromagnetic load current 5A stops flowing at the threshold of peak current 100, which is predetermined. After reaching the threshold of peak current 100, the electromagnetic load current 5A transfers in a retention state, and is chopped by the chopping signal generator 108 after the high-side driver 4 turns off (current for high side 81A turns off). In this situation, a wave form of the upper voltage of the electromagnetic load 103 is shown in FIG. 3. When the operation of the electromagnetic load 5 is finished, the electromagnetic load current 5A is rapidly interrupted in a short current-down period in order to quickly return the electromagnetic load 5 to the initial state.

When the control signal 29 turns off, the analog drive signal for the low-side driver 11 turns off at the falling edge of the control signal 29. The counter electromotive energy is generated by the electromagnetic load 5 at the drain side of the low-side driver 10 at the falling edge 39 of the drive signal (gate signal) for low-side driver 11. The drain voltage for low-side driver 46 jumps up to a specific voltage (a jumping voltage 300) due to the counter electromotive energy. The jumping voltage 300 is stored in the lower capacitor of electromagnetic load for noise or surge 9. Simultaneously, the jumping voltage 300 is input to the voltage detector 15 as the drain voltage for low-side driver 46. Then, the first current source controller 18 and the second current source controller 20 are controlled by the drive signal selector for current control 111, according to a result of detection by the voltage detector 15.

Figure 3:
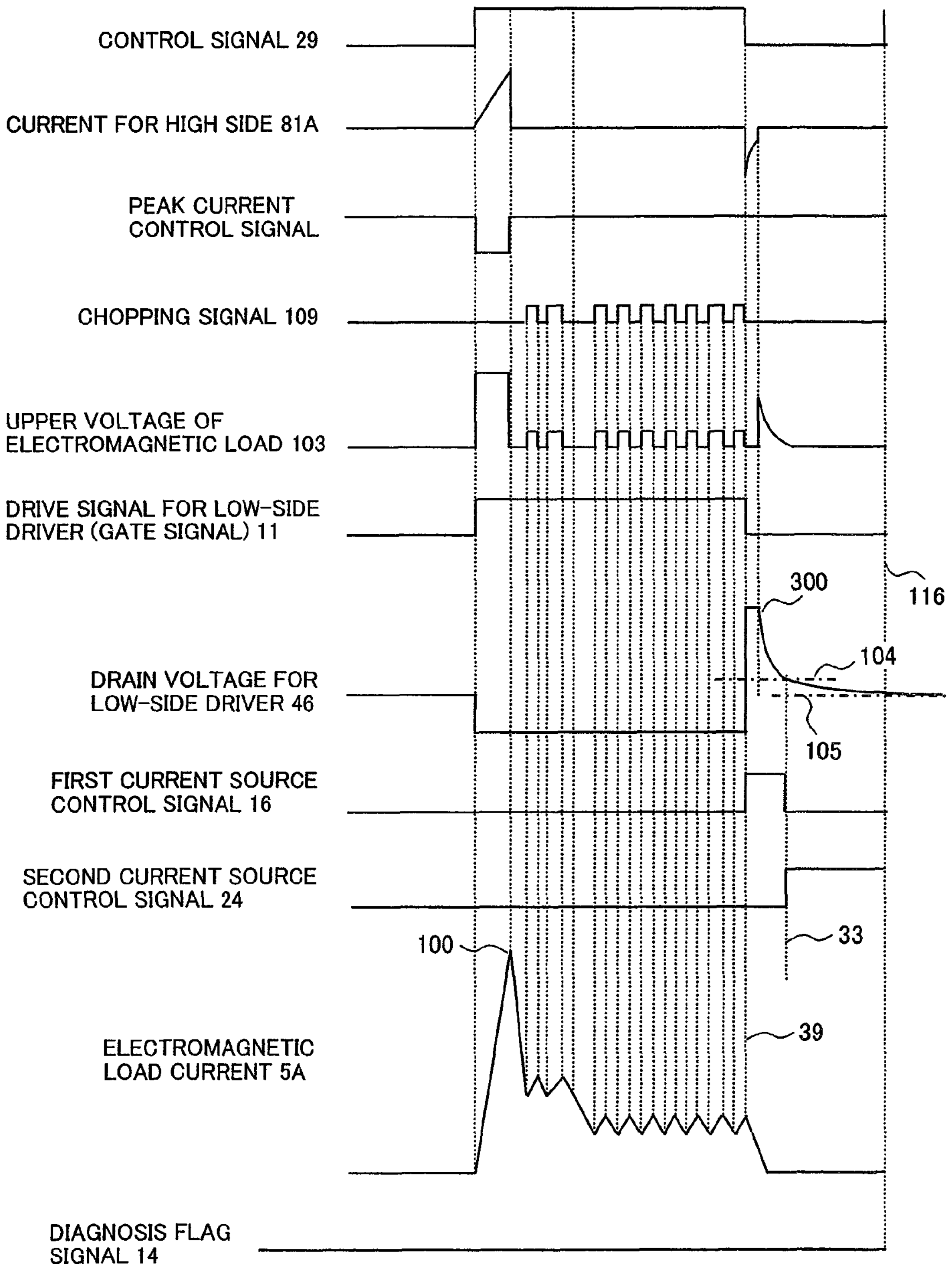
FIG. 3 shows an example of an operating waveform of a circuit in the internal combustion engine controller in accordance with the first embodiment.

If the drain voltage for low-side driver 46 exceeds a threshold for battery short 104, as shown in FIG. 3, a first current source control signal 16 is output as a high signal from the drive signal selector for current control 111, turning the first current source 17 on. As a result, the drain voltage for low-side driver 46 discharges electric charges stored in the lower capacitor of electromagnetic load for noise or surge 9 and rapidly attenuates the jumping voltage 300. Then, when the drain voltage for low-side driver 46 becomes the threshold for battery short 104 or lower, the first current source control signal 16 gets to low by the drive signal selector for current control 111, and the first current source 17 turns off. A second current source control signal 24 is output as high from the drive signal selector for current control 111 at a falling edge for first current source signal 33, and the second current source 19 turns on. As a result, the drain voltage for low-side driver 46 dramatically attenuates without extreme decreasing and converges on a default drain voltage for low-side driver 105 to reach a steady state.

Timing to diagnose whether the state is battery short or not is synchronized with the rising edge of the control signal 29. Because of a rapid start-up of the electromagnetic load 5 or generation of the counter electromotive energy, determination of battery short is difficult at any timing except for the rising edge of the control signal 29. If the drain voltage for low-side driver 46 exceeds the threshold for battery short 104 at this detection timing of battery short 116, it is determined that the state is battery short.

According to this embodiment, even if the drain voltage for low-side driver 46 jumps up to a specific voltage by the counter electromotive energy and is charged in the lower capacitor of electromagnetic load for noise or surge 9, the charged voltage can be rapidly attenuated before the detection timing of battery short 116.

Accordingly, even if the rotating speed of the internal combustion engine increases and the drive cycle of the control signal 29 becomes shorter, resulting in a short interval of the detection timing of battery short 116, the electromagnetic load 5 can be diagnosed with high precision and controlled at high speed without misdiagnosing that the state is battery short although the drive circuit and the electromagnetic load 5 are normal.

The method described above makes it possible that the current from the first current source 17 can flow only when the drain voltage for low-side driver 46 jumps up to the specific voltage due to the counter electromotive energy. This leads to an advantage of reduction in the heat generation.

Figure 18:
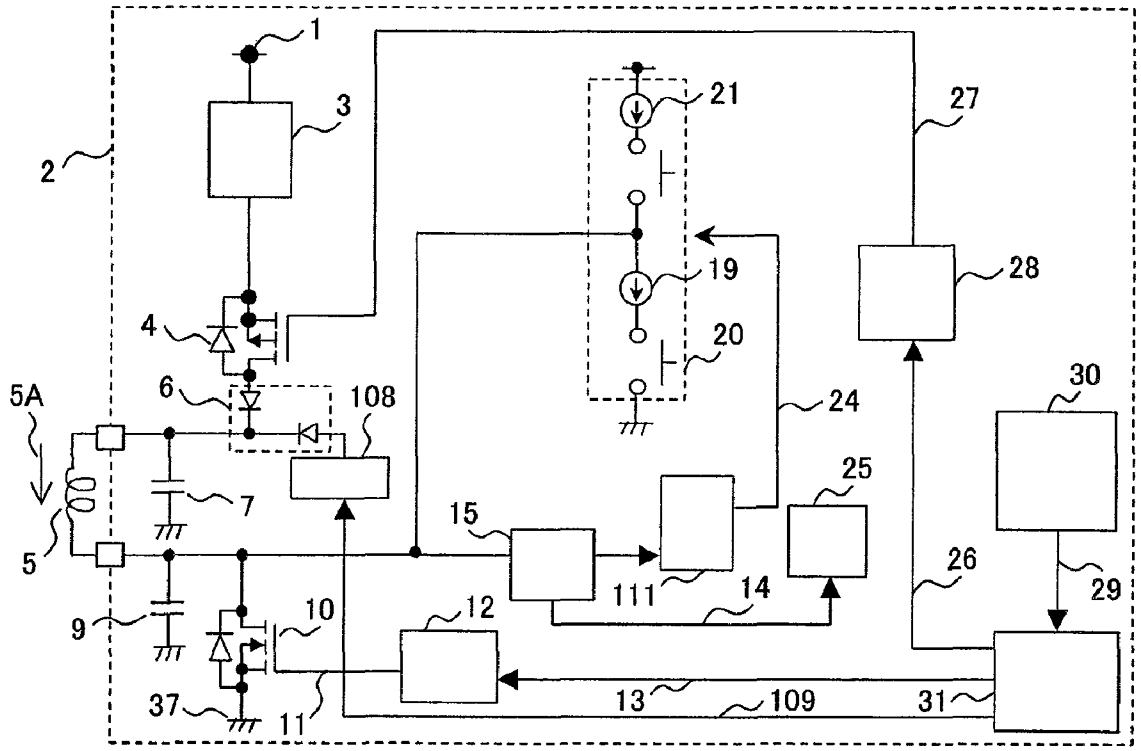
FIG. 18 a circuit configuration diagram of an internal combustion engine controller without a first current-source controller in the first embodiment.

In a configuration where the first current source controller 18 (including the first current source 17) is not provided and only the second current source controller 20 (including the second current source 19 and the third current source 21) is provided, that is, in a configuration shown in FIG. 18, the rapid attenuation of the counter electromotive energy (the rapid attenuation of the first counter drain voltage 300) described above cannot be expected. In FIG. 18, the same symbols as in the first embodiment denote elements identical with or common to those in the first embodiment. In the state shown in FIG. 18, even if the current passing through the electromagnetic load 5 is interrupted and the first counter drain voltage is detected by the drain voltage detector 15 to turn the second current source 19 on, the second current source 19 cannot rapidly discharge the voltage generated by the counter electromotive energy, which has been charged in the lower capacitor of electromagnetic load for noise or surge 9, because of the characteristics. Therefore, the first counter drain voltage of the counter electromotive energy gradually attenuates and reaches a given drain voltage as the attenuation curve 300 in timing charts shown in FIG. 19.

In this case, if the rotating speed of the internal combustion engine increases and the drive cycle of the control signal 29 becomes shorter, resulting in a short interval of the detection timing of battery short 116, the possibility increases that the state comes to the detection timing of battery short 116 while the drain voltage of the counter electromotive energy is still not below the threshold for battery short and that the state is misdiagnosed as battery short although the drive circuit and the electromagnetic load 5 are normal.

Second Embodiment

Figure 2:
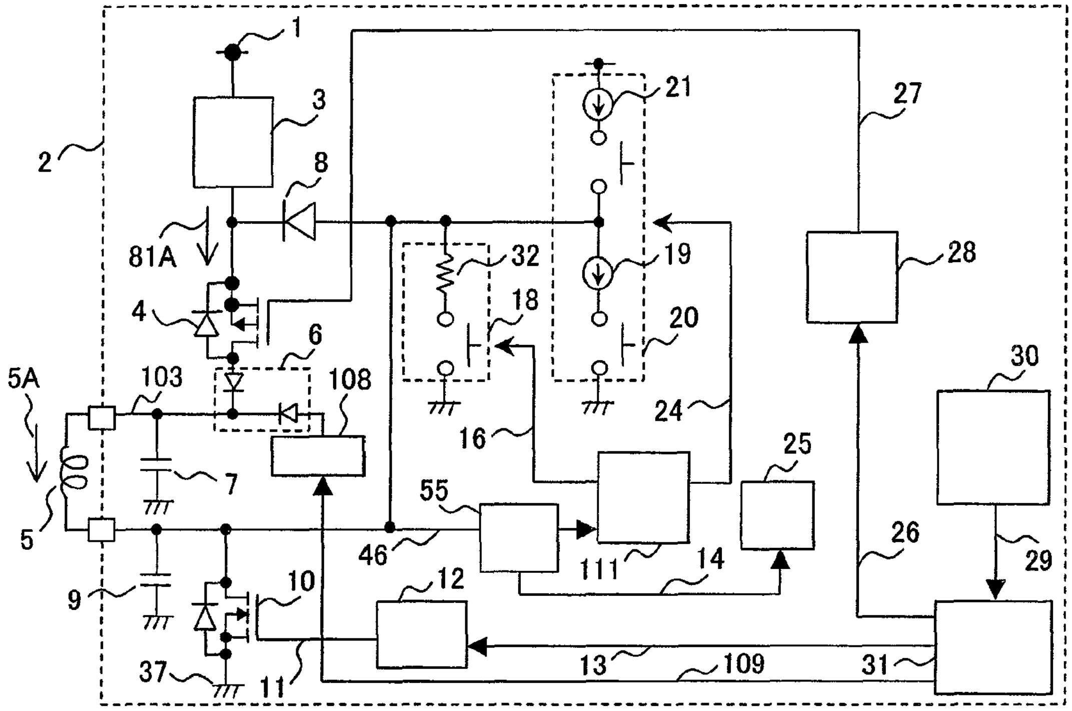
FIG. 2 is a circuit configuration diagram of an internal combustion engine controller in accordance with a second embodiment of the present invention.

With reference to FIG. 2, a description will be given of an internal combustion engine controller in accordance with a second embodiment of the present invention.

In the configuration of this embodiment, the first current source 17 shown in FIG. 1 is replaced with a first resistor for current source 32. The first resistor for current source 32 functions as a sink current resistor. The drain voltage for low-side driver 46, which has been charged in the lower capacitor of electromagnetic load for noise or surge 9, is consumed and discharged by the first resistor for current source 32. Therefore, the drain voltage for low-side driver 46 can rapidly attenuate as in the timing charts of the first embodiment shown in FIG. 3. Accordingly, the same advantages as in the first embodiment can be obtained in this configuration.

Third Embodiment

Figure 4:
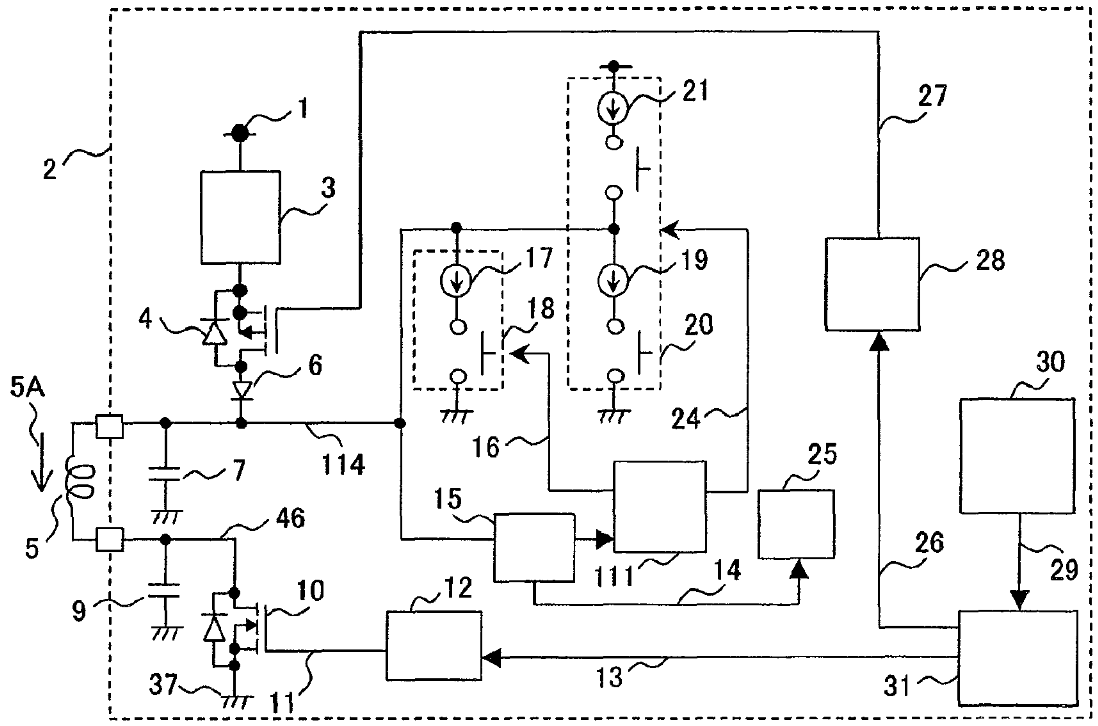
FIG. 4 is a circuit configuration diagram of an internal combustion engine controller in accordance with a third embodiment of the present invention.
Figure 5:
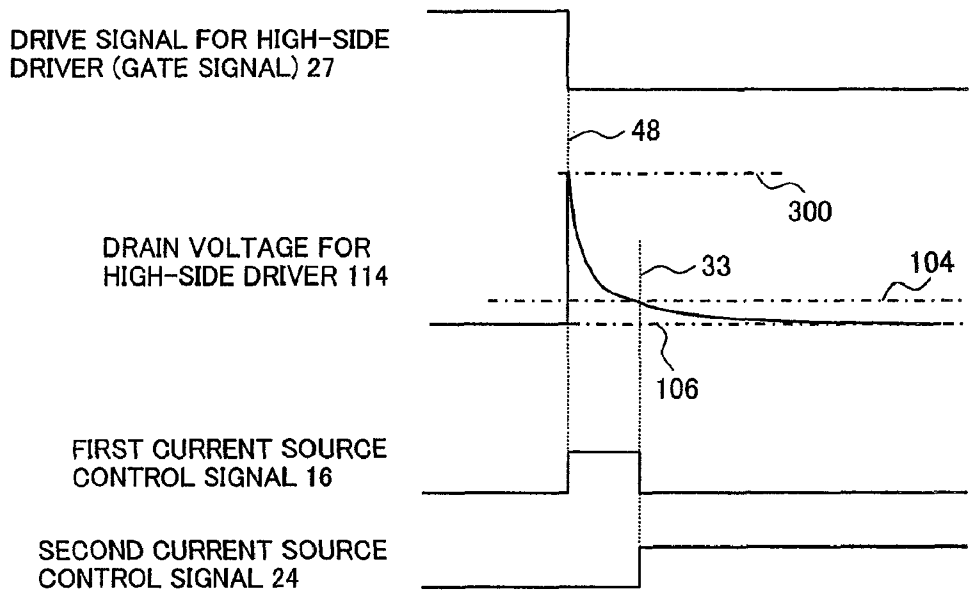
FIG. 5 shows an example of an operating waveform of a circuit in the internal combustion engine controller in accordance with the third embodiment.

With reference to FIGS. 4 and 5, a description will be given of an internal combustion engine controller in accordance with a third embodiment of the present invention.

In the configuration of this embodiment, the positions of the diagnosis circuit 25 and its peripheral circuits in the first embodiment (FIG. 1) are changed from the downstream side of the electromagnetic load 5 to the upstream side thereof as shown in FIG. 4. The peripheral circuits include the first current source controller 18, the second current source controller 20, the voltage detector 15, and the drive signal selector for current control 111. In the first embodiment, the fault diagnosis of the electromagnetic load 5 is performed by detecting the drain voltage for low-side driver 46. In this embodiment, the fault diagnosis of the electromagnetic load 5 is performed by means of detection of a drain voltage for high-side driver 114 by the voltage detector 15 and a diagnosis by the diagnosis circuit 25.

Waveforms according to the operation in this embodiment are shown in timing charts of FIG. 5. The drain voltage for high-side driver 114 increases up to the jumping voltage 300 due to the counter electromotive energy at a falling edge for gate signal of high-side driver 48. At this moment, the first current source control signal 16 is output as high from the drive signal selector for current control 111, turning the first current source 17 on, and rapidly attenuating the drain voltage for high-side driver 114. Then, the drain voltage for high-side driver 114 becomes equal to the threshold for battery short 104 or lower, making the first current source control signal 16 low, and turning the first current source 17 off. Meanwhile, the second current source control signal 24 is output as high from the drive signal selector for current control 111 at the falling edge for first current source signal 33, turning the second current source 19 on in this embodiment. As a result, the drain voltage for high-side driver 114 converges on a default drain voltage for high-side driver 106.

As described above, the operation in this embodiment is substantially identical with that in the first embodiment except that the drain voltage for low-side driver 46 is replaced with the drain voltage for high-side driver 114. Accordingly, in the configuration of this embodiment, as in the first embodiment, even if the rotating speed of the internal combustion engine increases and the drive cycle of the control signal 29 becomes shorter, resulting in a short interval of the detection timing of battery short 116, the electromagnetic load 5 can be diagnosed with high precision and controlled at high speed without misdiagnosing that the state is battery short although the drive circuit and the electromagnetic load 5 are normal.

Fourth Embodiment

Figure 6:
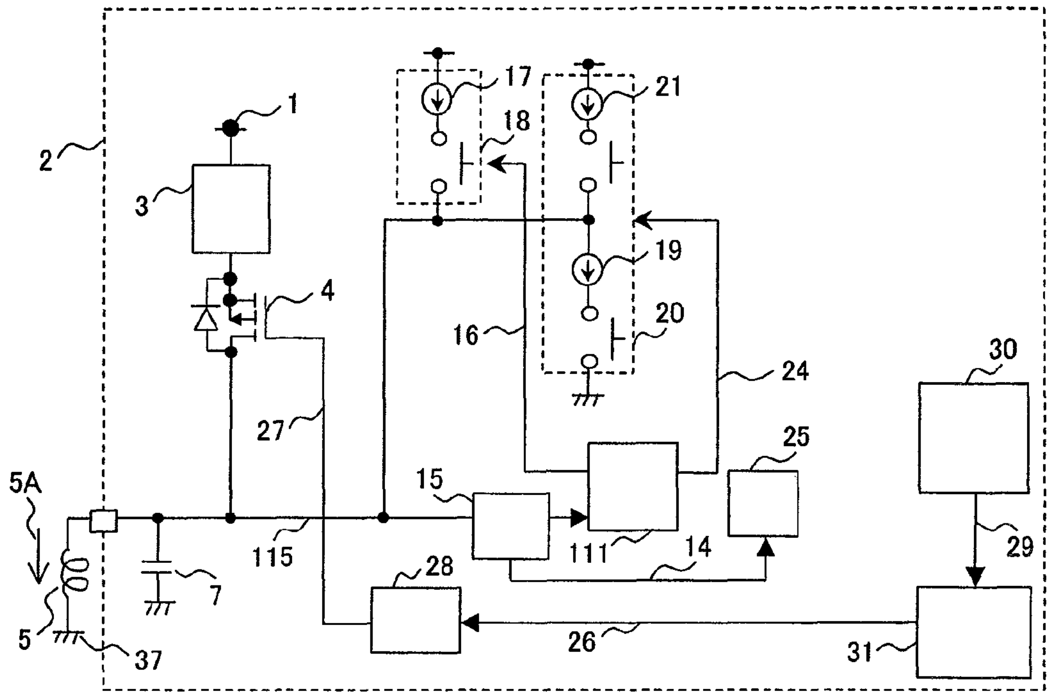
FIG. 6 is a circuit configuration diagram of an internal combustion engine controller in accordance with a fourth embodiment of the present invention.
Figure 7:
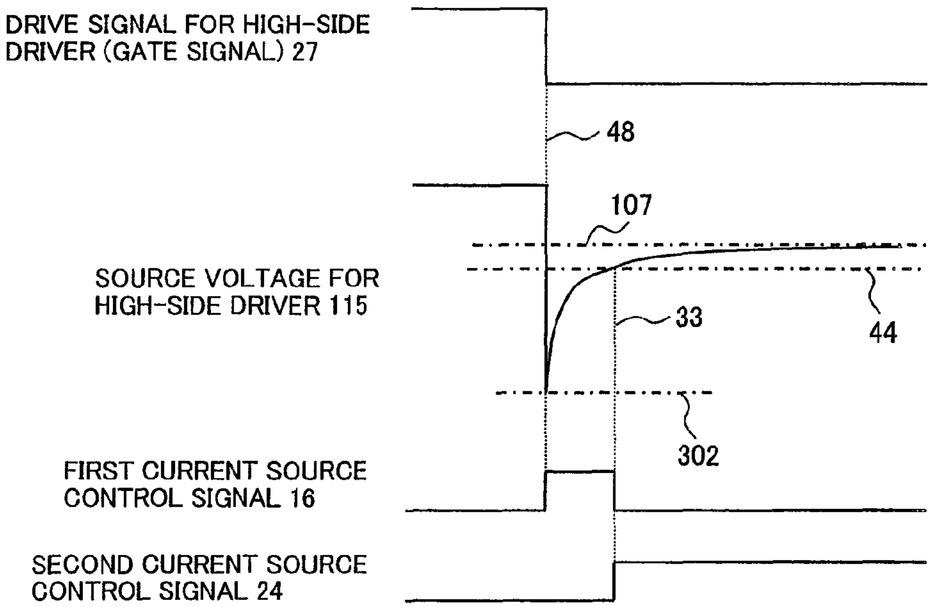
FIG. 7 shows an example of an operating waveform of a circuit in the internal combustion engine controller in accordance with the fourth embodiment.

With reference to FIGS. 6 and 7, a description will be given of an internal combustion engine controller in accordance with a fourth embodiment of the present invention. The first to third embodiments show the examples of the device that is capable of preventing misdiagnoses in a detection of battery short. This example shows an example of a device that is capable of preventing misdiagnoses in a detection of ground short.

As shown in FIG. 6, an internal combustion engine controller 2 according to this embodiment does not include a lower capacitor of electromagnetic load for noise or surge 9, a low-side driver 10, and a drive signal generator for low-side driver 12, which are located downstream of the electromagnetic load 5, in the internal combustion engine controller 2 of the third embodiment shown in FIG. 4.

The logical circuit 31 receives the control signal 29 from the microprocessor 30, and outputs the logical drive signal for high-side driver 26 to the drive signal generator for high-side driver 28. After receiving the logical drive signal for high-side driver 26, the drive signal generator for high-side driver 28 outputs the analog drive signal for high-side driver 27 to the high-side driver 4. The high-side driver 4 is driven by the analog drive signal for high-side driver 27 and allows the electromagnetic load current 5A to flow in the electromagnetic load 5. The fault diagnosis of the electromagnetic load 5 is performed by means of detection of a source voltage 115 of the high-side driver 4 by the voltage detector 15 and a diagnosis by the diagnosis circuit 25.

The operation of the internal combustion engine controller in accordance with this embodiment will be described with reference to timing charts shown in FIG. 7.

When the control signal 29 from the microprocessor 30 turns on, the drive signal of the high-side driver 4, that is, the analog drive signal for high-side driver 27 turns on, and the electromagnetic load current 5A flows through the electromagnetic load 5.

When the control signal 29 turns off, the gate signal of the high-side driver 4 turns off. At the falling edge for gate signal of high-side driver 48, the source voltage 115 of the high-side driver 4 drops down to a specific voltage (a falling voltage 302) due to the counter electromotive energy. The electric charges in the upper capacitor of electromagnetic load for noise or surge 7 are discharged and decreased due to the falling voltage 302. At the same time, the falling voltage 302 is input to the voltage detector 15 as the source voltage for high-side driver 115. Then, the first current source controller 18 and the second current source controller 20 are controlled by the drive signal selector for current control 111 according to a result of the detection by the voltage detector 15.

When the source voltage for high-side driver 115 is lower than a threshold for ground short 44, the first current source control signal 16 is output as high from the drive signal selector for current control 111, turning the first current source 17 on. As a result, the source voltage for high-side driver 115 rapidly increases as shown in FIG. 7. When the source voltage for high-side driver 115 becomes equal to the threshold for ground short 44 or higher, the first current source control signal 16 becomes low and the first current source 17 turns off. At this falling edge for first current source signal 33, the second current source control signal 24 is output as high from the drive signal selector for current control 111 and the third current source 21 turns on. As a result, the source voltage for high-side driver 115 converges on a default source voltage for high-side driver 107.

Timing to diagnose whether the state is ground short or not is, as well as the timing of the diagnosis of battery short in the first embodiment, synchronized with the rising edge of the control signal 29. If the source voltage for high-side driver 115 falls below the threshold for ground short 44 at this detection timing of ground short, it is determined that the state is ground short.

However, through the above operation, the discharged voltage can rapidly increase before the detection timing of ground short even if the source voltage for high-side driver 115 decreases to a specific voltage due to the counter electromotive energy to discharge the upper capacitor of electromagnetic load for noise or surge 7.

Accordingly, even if the rotating speed of the internal combustion engine increases and the drive cycle of the control signal 29 becomes shorter, resulting in a short interval of the detection timing of ground short, the electromagnetic load 5 can be diagnosed with high precision and controlled at high speed without misdiagnosing that the state is ground short although the drive circuit and the electromagnetic load 5 are normal.

Fifth Embodiment

Figure 8:
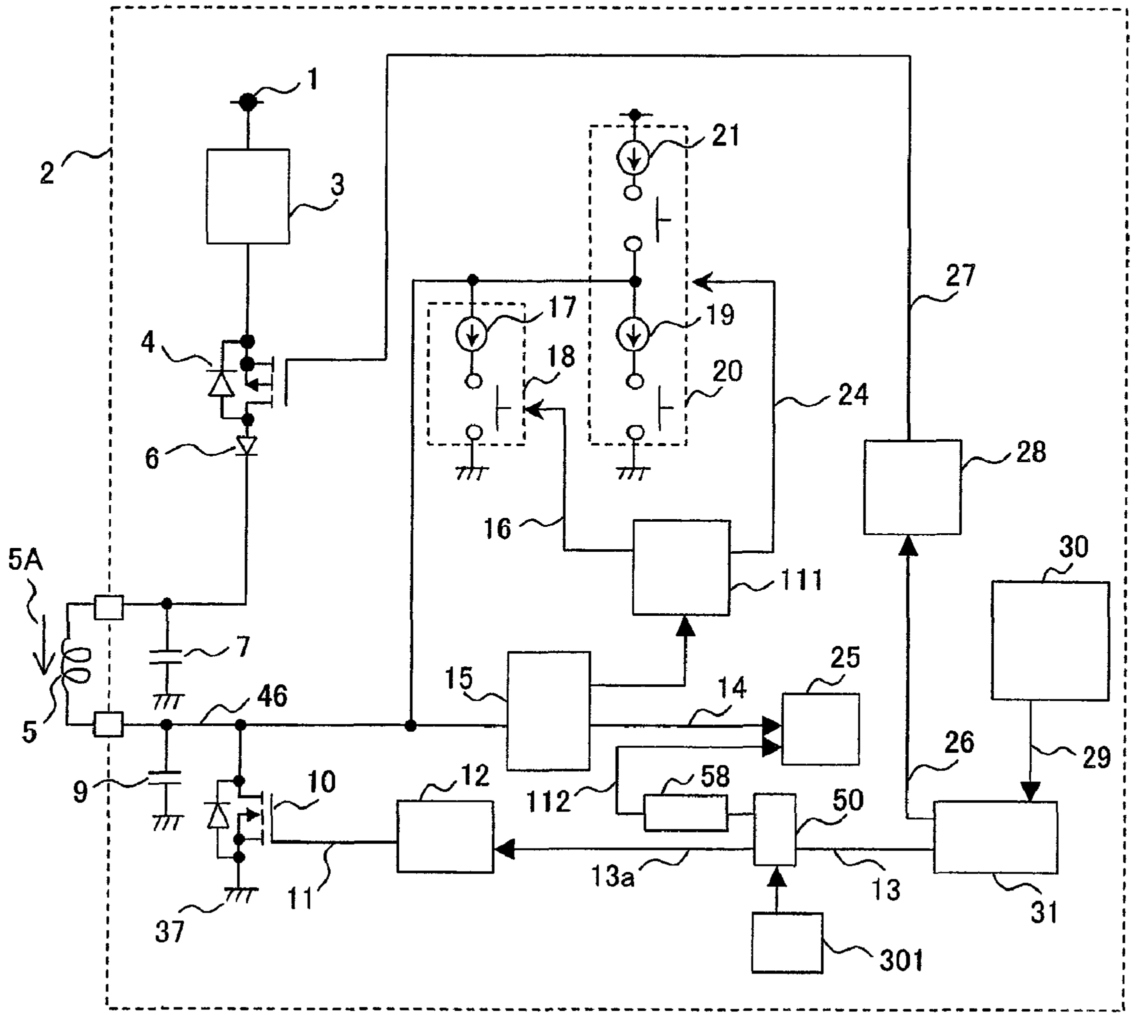
FIG. 8 is a circuit configuration diagram of an internal combustion engine controller in accordance with a fifth embodiment of the present invention.
Figure 9:
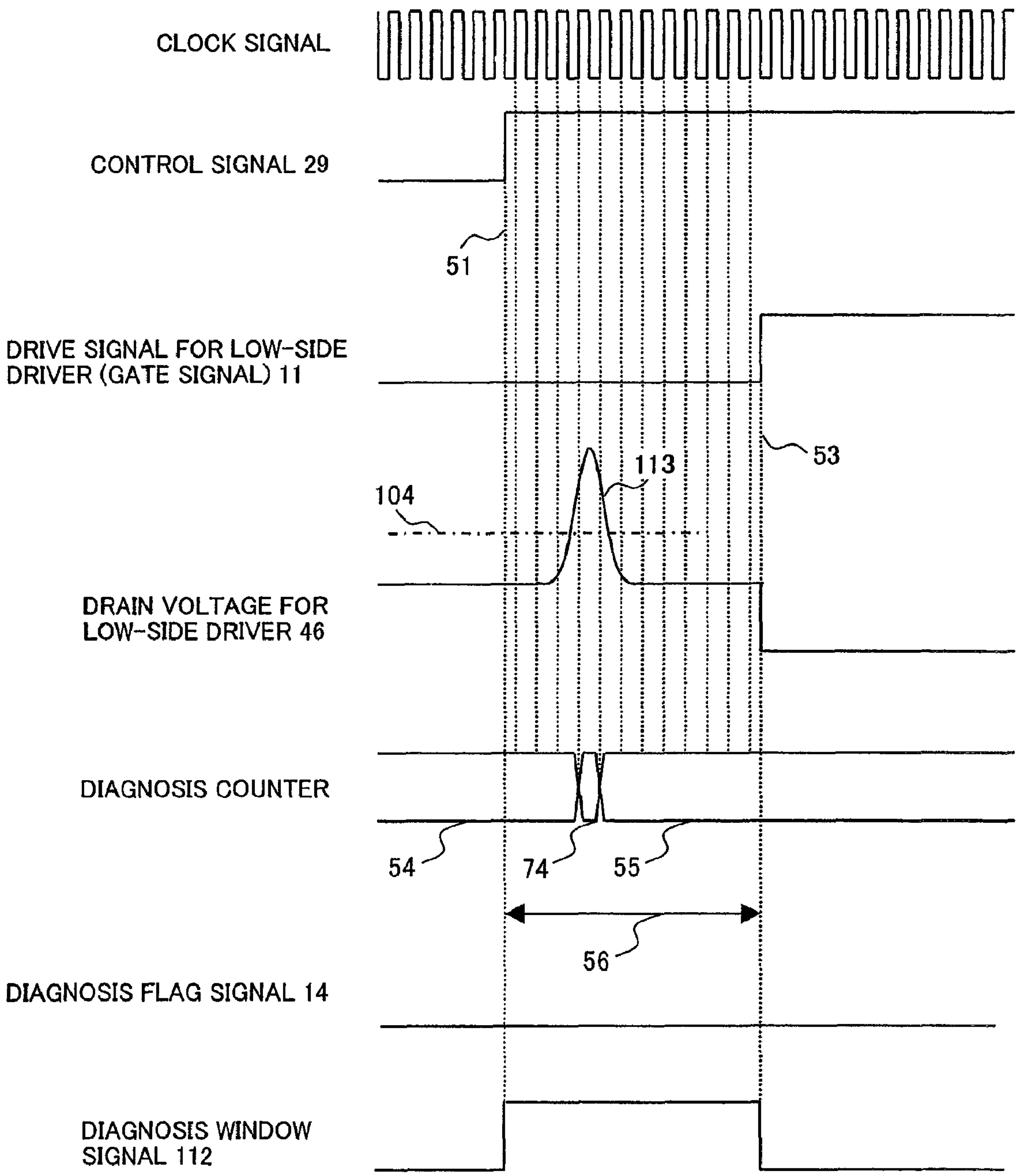
FIG. 9 shows an example of an operating waveform of a circuit in the internal combustion engine controller in accordance with the fifth embodiment.

With reference to FIGS. 8 and 9, a description will be given of an internal combustion engine controller in accordance with a fifth embodiment of the present invention.

The internal combustion engine controller 2 in accordance with this embodiment has the same circuit configuration as that of the first embodiment, except for the following matters. The internal combustion engine controller 2 of this embodiment does not include the regeneration diode 8 and the chopping signal generator 108 shown in FIG. 1 (however, the regeneration diode 8 and the chopping signal generator 108 may be provided), and is provided with a filter time generator 50, a diagnosis window signal generator 58, and a delay time selector 301, which will be described below.

A given delay time is provided in the first logical drive signal for low-side driver 13 by the filter time generator 50 and becomes high or low with a delay from the rising edge or the falling edge of the control signal 29. The delay time is short not to affect the high-speed operation of the internal combustion engine having the internal combustion engine controller 2. The first logical drive signal for low-side driver 13 with the delay time, that is, a second logical drive signal for low-side driver 13*a* is input to the drive signal generator for low-side driver 12. As a result, the delay time same as the above-mentioned delay time is provided between the control signal 29 and the analog drive signal for low-side driver 11. During the delay time, the control of the electromagnetic load current 5A does not start even if the control signal 29 is input, and the potential level of the drain voltage for low-side driver 46 does not fluctuate.

The delay time generated by the filter time generator 50 is input to the diagnosis window signal generator 58. A diagnosis window signal 112 is output from the diagnosis window signal generator 58 only during the delay time, and then input to the diagnosis circuit 25. In the diagnosis circuit 25, a diagnosis counter operates while the diagnosis window signal 112 is on, and counts a time while the drain voltage for low-side driver 46 exceeds the threshold for battery short or falls below the threshold for ground short.

FIG. 9 shows timing charts when disturbance, such as noises, interferes the drain voltage for low-side driver 46 in the internal combustion engine controller 2 having the above circuit configuration. The diagnosis of battery short or ground short of the electromagnetic load 5 is triggered by a rising edge 51 for the control signal 29 and synchronized with the rising edge of the clock signals while the diagnosis window signal 112 is on. The diagnosis window signal 112 turns on at the rising edge 51 for the control signal 29 and turns off at the rising edge 53 for the analog drive signal for the low-side driver 11. The analog drive signal for the low-side driver 11 is delayed by a delay time 56 from the rising edge 51 for control signal 29. That is, the diagnosis window signal 112 is on during the delay time 56.

When the diagnosis window signal 112 is on, the diagnosis counter of the diagnosis circuit 25 counts a time while the drain voltage for low-side driver 46 exceeds the threshold for battery short or falls below the threshold for ground short as described above, and then diagnoses the battery short or the ground short. In the diagnosis, if the number of counting up of the diagnosis counter is less than a predetermined diagnosis count number, the diagnosis flag signal 14 is not output. The predetermined diagnosis count number can be set in advance, for example, so as to be equal to the number of times which the clock signal rises during the delay time 56.

FIG. 9 shows a case in which the drain voltage for low-side driver 46 increases due to an interference of noises. The predetermined diagnosis count number is set to be 12 times in advance. As shown in FIG. 9, the drain voltage for low-side driver 46 suffers an electric potential change by noise 113. While the drain voltage for low-side driver 46 exceeds the threshold for battery short 104, the diagnosis counter counts up from an initial counter condition 54 in synchronization with the rising edge of the clock signal. Counting up is twice in FIG. 9, a first counter condition 74 and a second counter condition 55. Since the number of this counting up is less than the predetermined diagnosis count number, the diagnosis flag signal 14 is not output. Therefore, the electric potential change by noise 113 is not diagnosed as battery short, preventing misdiagnosis.

If the number of the counting up is equal to the predetermined diagnosis count number (12 times in this embodiment) or more, the diagnosis flag signal 14 turns on at the rising edge 53 for the analog drive signal for low-side driver 11, and the state is diagnosed as battery short.

The above description refers to a case in which the drain voltage for low-side driver 46 increases due to the noises. Similarly, in the case where the drain voltage for low-side driver 46 decreases, comparing the number of the counting up to the predetermined diagnosis count number while the diagnosis window signal 112 is on prevents misdiagnosis as ground short. Through the above method, it is possible to prevent the misdiagnosis that the state of the electromagnetic load 5 is battery short or ground short, caused by an unexpected disturbance such as noise.

In the internal combustion engine controller 2 in accordance with this embodiment, the delay time 56 can be changed by the delay time selector 301 shown in FIG. 8 and the conditions to turn on the diagnosis flag signal 14 also can be changed by varying the predetermined diagnosis count number. Accordingly, the internal combustion engine controller 2 has advantage that misdiagnosis can be prevented under the diverse conditions by changing the delay time 56 or the predetermined diagnosis count number.

Sixth Embodiment

Figure 10:
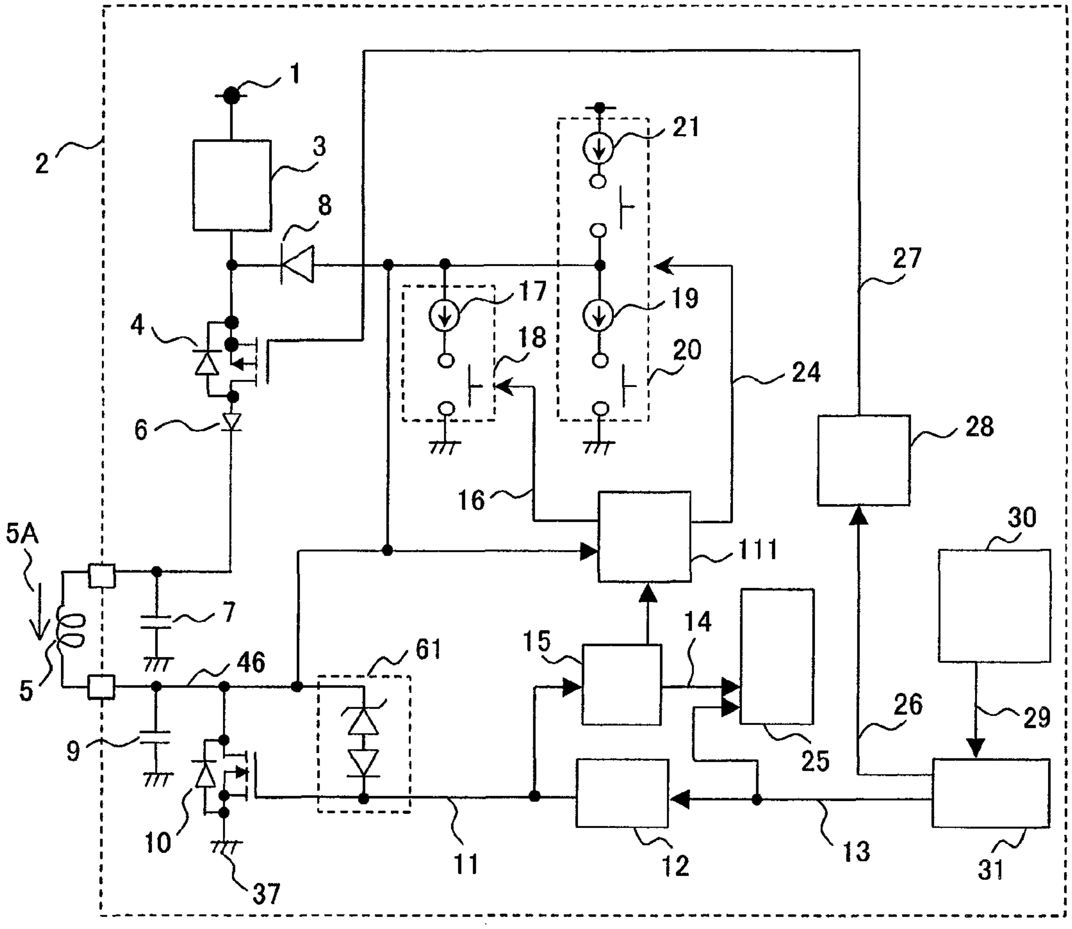
FIG. 10 is a circuit configuration diagram of an internal combustion engine controller in accordance with a sixth embodiment of the present invention.
Figure 11:
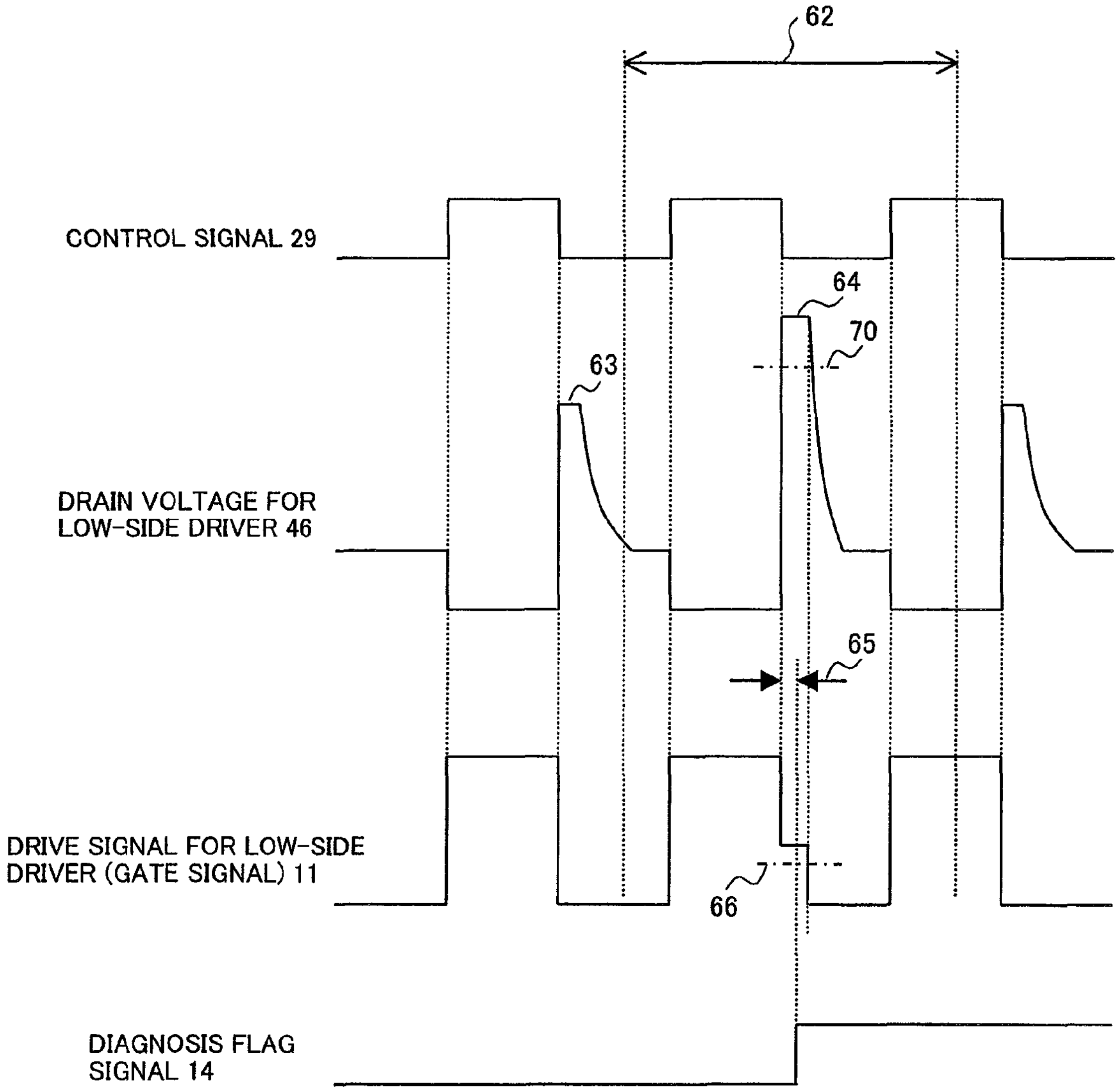
FIG. 11 shows an example of an operating waveform of a circuit in the internal combustion engine controller in accordance with the sixth embodiment.

With reference to FIGS. 10 and 11, a description will be given of an internal combustion engine controller in accordance with a sixth embodiment of the present invention. This embodiment is an example of an internal combustion engine controller which can detect a breakdown or open state of a regeneration diode.

The internal combustion engine controller 2 in accordance with this embodiment has the same circuit configuration as that of the first embodiment, except for the following matters. The internal combustion engine controller 2 of this embodiment does not include the chopping signal generator 108 shown in FIG. 1 (however, the chopping signal generator 108 may be provided), being provided with an active clamper 61 described below and the voltage detector 15 detecting the gate signal 11 of the low side drier 10.

The active clamper 61 supplies a current to the gate of the low-side driver 10, forcing the gate signal high and turning the low-side driver 10 on if the drain voltage for low-side driver 46 exceeds a specified value.

The diagnosis circuit 25 inputs the diagnosis flag signal 14 from the voltage detector 15 and the first logical drive signal for low-side driver 13 from the logical circuit 31, and compares these two signals with each other to detect the breakdown or open state of the regeneration diode 8.

With reference to FIG. 11, a description will be given of a case in which the regeneration diode 8 is in the breakdown or open state. It is assumed that the regeneration diode 8 is broken down or opened during the regeneration diode breakdown time 62. Normally, the drain voltage 46 for low-side driver rises up to the booster voltage 63 due to the regeneration diode 8. However, if the regeneration diode 8 is broken down or opened, the counter electromotive energy cannot be regenerated in the booster circuit 3 during the regeneration diode breakdown time 62, causing the drain voltage for low-side driver 46 to increase beyond the booster voltage 63. When the drain voltage for low-side driver 46 exceeds a predetermined second threshold for regeneration diode breakdown detection 70, the active clamper 61 turns on. Then, a current is supplied from the drain of the low-side driver 10 to the gate thereof, and the analog drive signal for low-side driver 11, that is, the gate signal of the low-side driver 10 is forcedly raised at least during a filter time 65, which is described later. As a result, the low-side driver 10 turns on and the jumped counter electromotive energy is clamped to a clamp voltage 64.

Now, a description will be given of a method for detecting the breakdown or open state of the regeneration diode 8.

The jumped counter electromotive energy is clamped to the clamp voltage 64. In this situation, the gate signal is raised as described above. The voltage detector 15 detects the gate signal and outputs the diagnosis flag signal 14 as high if the gate signal is beyond a predetermined first threshold for regeneration diode breakdown detection 66. A period of time after the gate signal is forcedly raised until the diagnosis flag signal 14 is output as high is called "filter time 65."

On the other hand, when the gate signal is forcedly raised by the active clamper 61, the control signal 29 is always low as shown in FIG. 11. Accordingly, the first logical drive signal for low-side driver 13, which is controlled by the control signal 29, is also always low.

Therefore, the diagnosis circuit 25 detects a state in which the diagnosis flag signal 14 is high and the first logical drive signal for low-side driver 13 is low. This is a state in which the gate signal is raised during the filter time 65 although the control signal of the low-side driver 10 is low. This means that the active clamper 61 is in operation and the regeneration diode 8 is broken down or opened. In this way, the diagnosis circuit 25 can detect the brake down or open state of the regeneration diode 8 with high precision.

Further, in order to ensure a high detection precision even if disturbance, such as noises, occurs in the gate of the low-side driver 10, the state of the regeneration diode 8 is detected within the filter time 65 from the falling edge of the analog drive signal for low-side driver 11.

Seventh Embodiment

Figure 12:
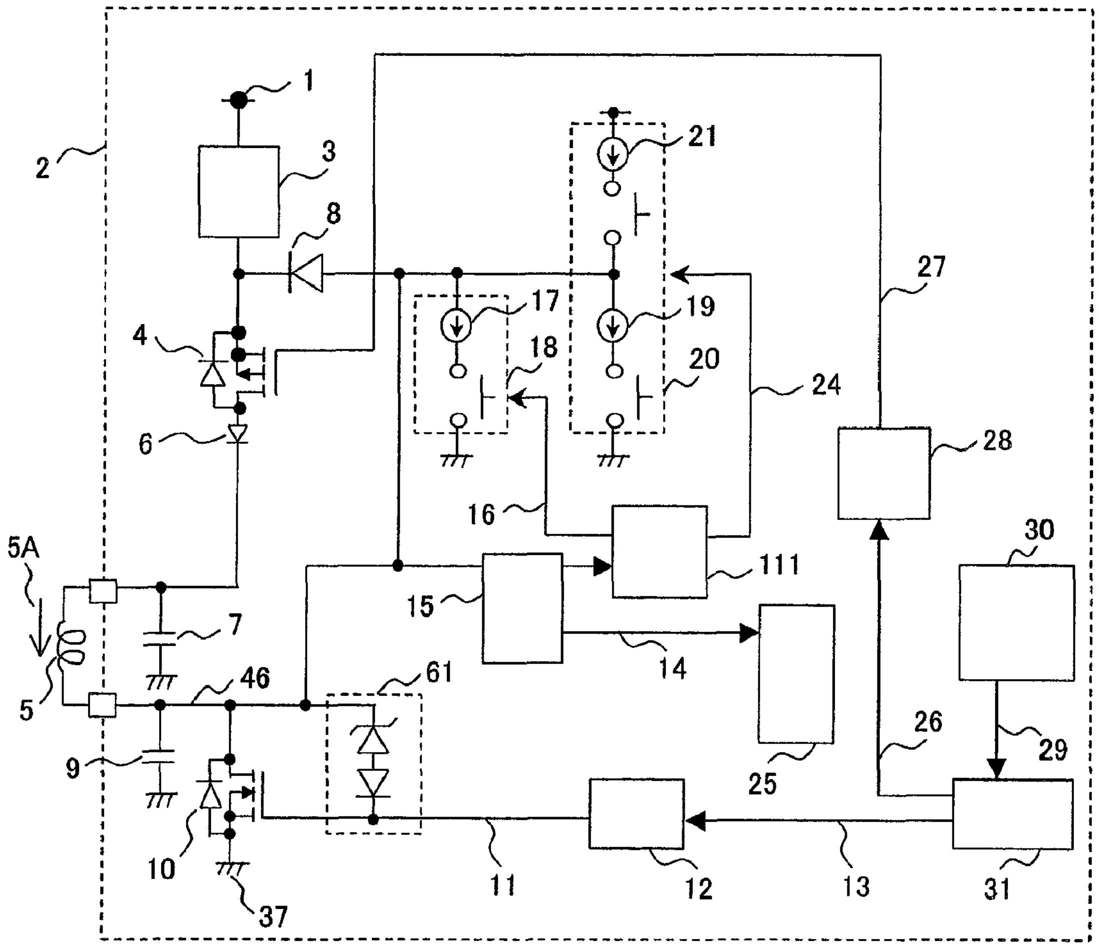
FIG. 12 is a circuit configuration diagram of an internal combustion engine controller in accordance with a seventh embodiment of the present invention.
Figure 13:
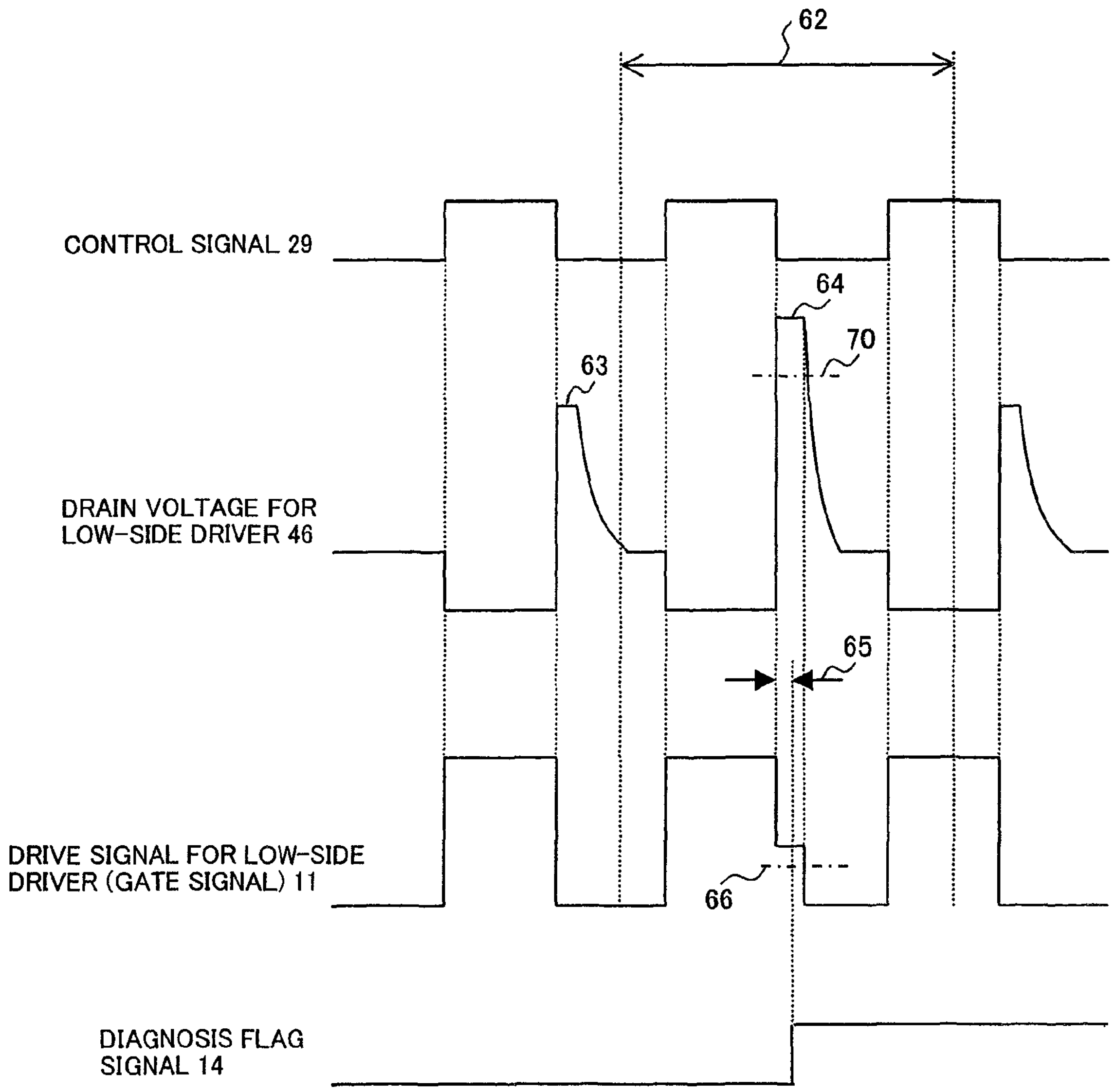
FIG. 13 shows an example of an operating waveform of a circuit in the internal combustion engine controller in accordance with the seventh embodiment.

With reference to FIGS. 12 and 13, a description will be given of an internal combustion engine controller in accordance with a seventh embodiment of the present invention. This embodiment is another example of the internal combustion engine controller which can detect the breakdown or open state of the regeneration diode. As a detecting method, while the voltage of the gate signal of the low-side driver 10 is used in the sixth embodiment, the drain voltage 46 for the low-side driver 10 is used in this embodiment. The operation of the first and second current source controllers 18, 20 and the regeneration diode 8 is identical with that in the first embodiment.

FIG. 12 is a diagram showing a circuit of an internal combustion engine controller 2 in accordance with this embodiment. A difference from the sixth embodiment is that the drain voltage 46 for the low-side driver 10 is input to the voltage detector 15. Timing charts shown in FIG. 13 are identical with those in the sixth embodiment.

As described in the sixth embodiment, if the regeneration diode 8 is broken down or opened, the counter electromotive energy cannot be regenerated in the booster circuit 3 during the regeneration diode breakdown time 62 as shown in FIG. 13. This makes the drain voltage for low-side driver 46 exceed the second threshold for regeneration diode breakdown detection 70 and jump up to the clamp voltage 64.

Now, a description will be given of a method for detecting the breakdown or open state of the regeneration diode 8 in this embodiment. The jumped drain voltage for low-side driver 46 is detected by the voltage detector 15. Then, when the drain voltage for low-side driver 46 exceeds the second threshold for regeneration diode breakdown detection 70, the diagnosis flag signal 14 is output to the diagnosis circuit 25. The diagnosis circuit 25 outputs the diagnosis flag signal 14 as high. As a result, the brake down or open state of the regeneration diode 8 can be detected.

Moreover, in order to ensure a high detection precision even if disturbance, such as noises, occurs in the gate of the low-side driver 10, the state of the regeneration diode 8 is detected within the filter time 65 from the falling edge of the analog drive signal for low-side driver 11.

By the process mentioned above, the brake down or open state of the regeneration diode 8 can be detected with higher precision.

Eighth Embodiment

Figure 14:
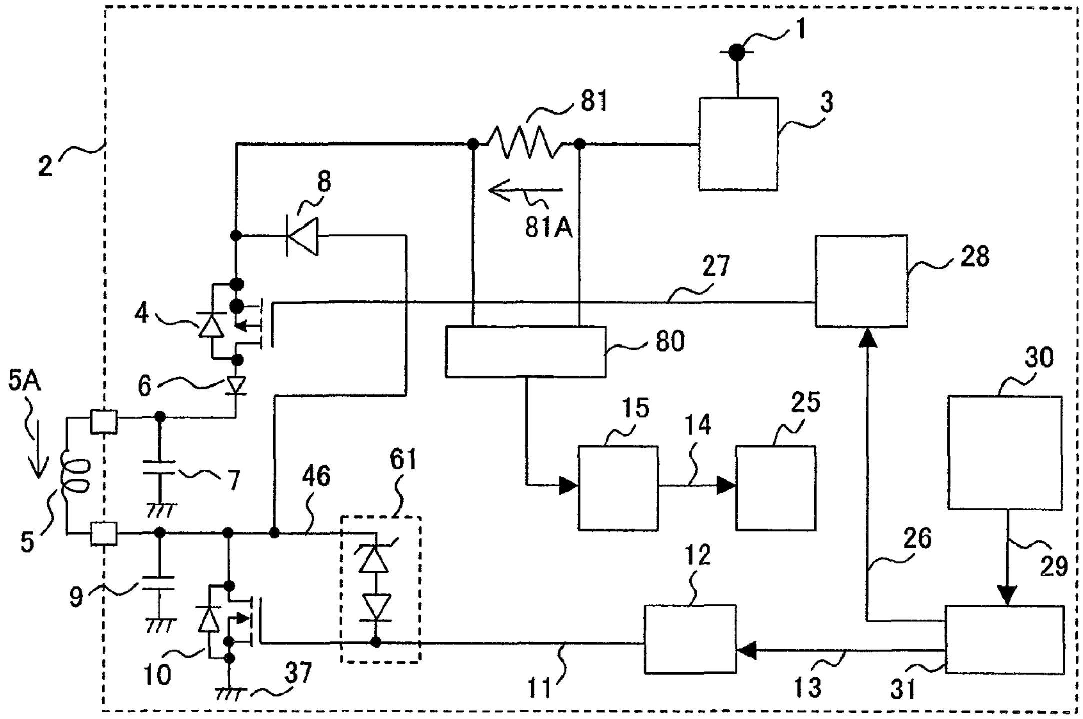
FIG. 14 is a circuit configuration diagram of an internal combustion engine controller in accordance with an eighth embodiment of the present invention.
Figure 16:
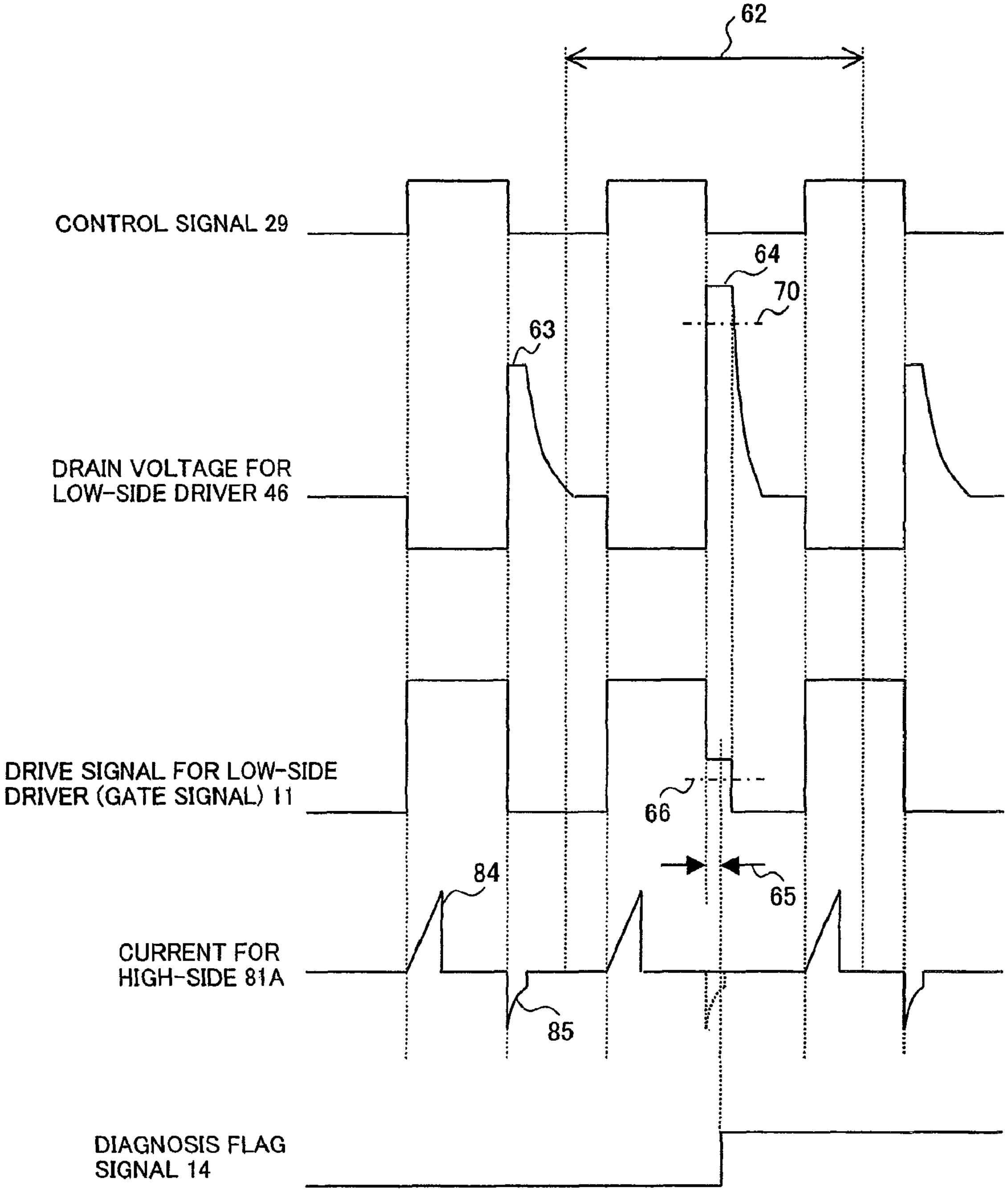
FIG. 16 shows an example of an operating waveform of a circuit in the internal combustion engine controller in accordance with the eighth embodiment.

With reference to FIGS. 14 and 16, a description will be given of an internal combustion engine controller in accordance with an eighth embodiment of the present invention. This embodiment is another example of the internal combustion engine controller which can detect the breakdown or open state of the regeneration diode. As a detecting method, a reverse current of a current flowing between the booster circuit 3 and the high-side driver 4 is detected. The current flowing between the booster circuit 3 and the high-side driver 4 is hereinafter referred to as "current for high side."

FIG. 14 is a diagram showing a circuit of an internal combustion engine controller 2 in accordance with this embodiment. A difference from the seventh embodiment is that a current detection resistor 81 and a current detector 80 are disposed between the booster circuit 3 and the high-side driver 4, and that a current detected by the current detector 80 is input to the voltage detector 15. The first current source controller 18, the second current source controller 20, the first current source 17, the second current source 19, the third current source 21, and the drive signal selector for current control 111 are omitted from the description. Timing charts shown in FIG. 16 are the same as those of the seventh embodiment, except for a waveform of the current for high side 81A which is added to FIG. 16. The current for high side 81A flows through the current detection resistor 81.

As described in the sixth and seventh embodiments, if the regeneration diode 8 is broken down or opened, the counter electromotive energy cannot be regenerated into the booster circuit 3 during the regeneration diode breakdown time 62, as shown in FIG. 16. As a result, the drain voltage for low-side driver 46 exceeds the second threshold for regeneration diode breakdown detection 70 and jumps up to the clamp voltage 64.

Now, a description will be given of a method for detecting the breakdown or open state of the regeneration diode 8 in this embodiment. As shown in FIG. 16, when the control signal 29 and the analog drive signal for low-side driver 11 turns on, the current for high side 81A flows from the upstream side to the downstream side, showing a waveform of a peak current 84. When the analog drive signal for low-side driver 11 turns off, in a normal case, a regeneration current flows through the regeneration diode 8 and the current for high side 81A, which flows through the current detection resistor 81, becomes the reverse current 85.

However, if the regeneration diode 8 is broken down or opened, the reverse current 85 does not flow through the current detection resistor 81 because the regeneration current cannot flow. In the waveform of the current for high side 81A in FIG. 16, the dotted line indicates the reverse current 85 that should flow when the regeneration diode 8 is normal. Therefore, the current detector 80 does not detect the reverse current 85, leading to the detection of the brake down or open state of the regeneration diode 8.

Ninth Embodiment

Figure 15:
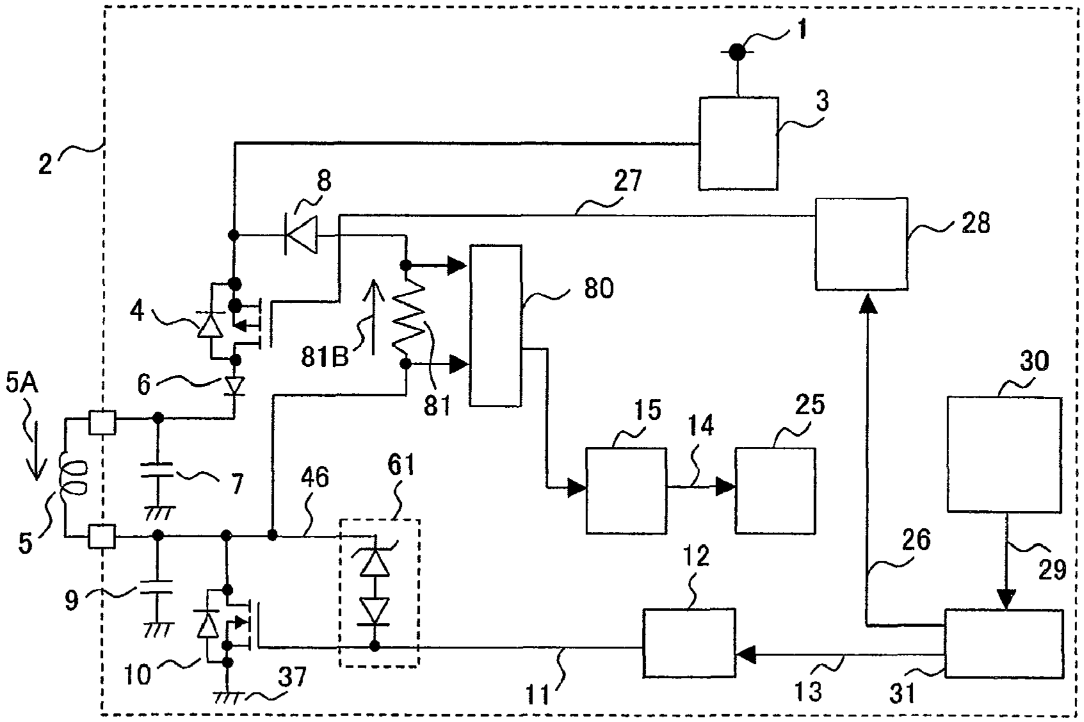
FIG. 15 is a circuit configuration diagram of an internal combustion engine controller in accordance with a ninth embodiment of the present invention.
Figure 17:
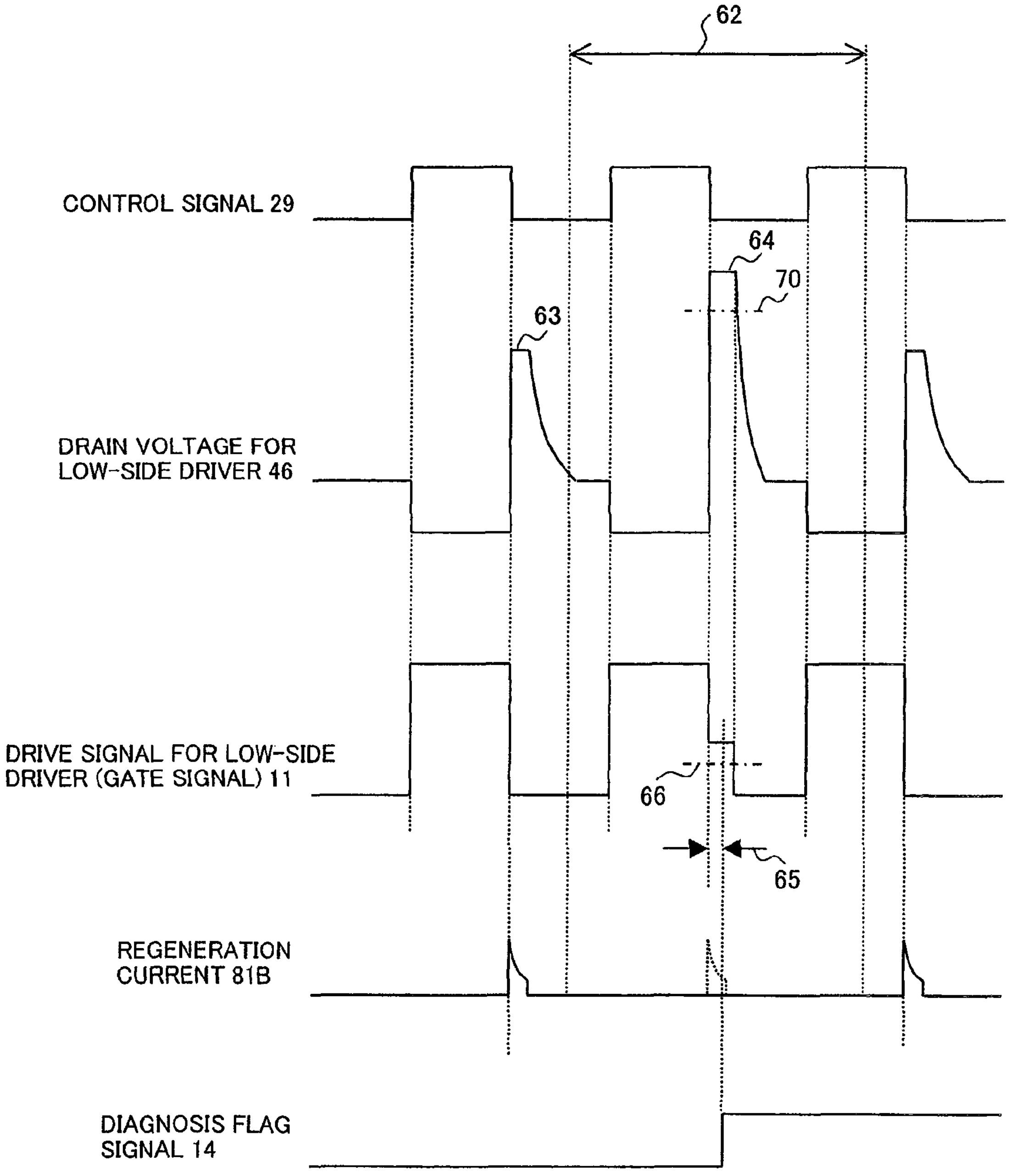
FIG. 17 shows an example of an operating waveform of a circuit in the internal combustion engine controller in accordance with the ninth embodiment.

With reference to FIGS. 15 and 17, a description will be given of an internal combustion engine controller in accordance with a ninth embodiment of the present invention. This embodiment is another example of the internal combustion engine controller which can detect the breakdown or open state of the regeneration diode. As a detecting method, the regeneration current is detected.

FIG. 15 is a diagram showing a circuit of an internal combustion engine controller 2 in accordance with this embodiment. The internal combustion engine controller 2 is the same as that of the eighth embodiment shown in FIG. 14, except for the locations of the current detector 80 and the current detection resistor 81. The current detector 80 and the current detection resistor 81 are located between the regeneration diode 8 and the low-side driver 10. The regeneration current 81B flows through the current detection resistor 81. Timing charts shown in FIG. 17 are same as those of the eighth embodiment, except that a waveform of the regeneration current 81B substitutes for that of the current for high side 81A.

As described in the eighth embodiment, when the analog drive signal for low-side driver 11 turns off, in a normal case, the regeneration current 81B flows through the regeneration diode 8 as well as through the current detection resistor 81.

However, if the regeneration diode 8 is broken down or opened, the regeneration current 81B does not flow through the current detection resistor 81. In the waveform of the regeneration current 81B in FIG. 17, the dotted line indicates the regeneration current that should flow when the regeneration diode 8 is normal. Therefore, the current detector 80 does not detect the regeneration current 81B, leading to the detection of the brake down or open state of the regeneration diode 8.

The present invention relates to internal combustion engine controllers which drive an electromagnetic load, such as a fuel injector, by a battery voltage or a boosted battery voltage in automobiles, motorcycles, farm vehicles, industrial machines, or ships which use gasoline or light oil as fuel. In addition, the present invention is applied to controllers whose drive cycle changes, such as internal combustion engines, requiring a high diagnosis performance.

What is claimed is:

1. A load controller for controlling an electromagnetic load, said load controller comprising:

a power supply for supplying power to the electromagnetic load;

a driver for the electromagnetic load, said driver being disposed between the electromagnetic load and at least one of the power supply and ground; and diagnosing means for diagnosing a fault in a circuit configuration by detecting a voltage abnormality between the electromagnetic load and driver; wherein, interruption and energization of the electromagnetic load are performed repeatedly;

timing of detection of voltage abnormality is set to synchronize with energization start timing of the electromagnetic load;

the load controller further includes a first current source controller for rapidly attenuating counter electromotive energy that is generated at a time of interruption of the electromagnetic load;

the first current source controller is located between a position at which a jumping voltage is generated by the counter electromotive energy and ground, in parallel with a current source of a second current source controller that causes a current in the electromagnetic load to converge to and remain at, a given level; and the electromagnetic load controller further includes switching means for switching the first current source controller and the current source according to a given voltage threshold.

2. A load controller for controlling an electromagnetic load, said load controller comprising:

means for rapidly attenuating counter electromagnetic energy that is generated at a time when current flow to the electromagnetic load is interrupted; and a first current source controller as the means for controlling current to achieve said rapid attenuating of said counter electromotive energy; wherein, interruption and energization of the electromagnetic load are performed repeatedly;

timing of detection of a the voltage abnormality is set to synchronize with an energization start timing of the electromagnetic load;

the first current source controller is located between a position at which a jumping voltage is generated by the counter electromotive energy and ground, in parallel with a current source of a second current source controller that causes a current in the electromagnetic load to converge to and remain at, a given level; and the electromagnetic load controller further includes switching means for switching the first current source controller and the current source according to a given voltage threshold.

3. The load controller according to claim 1, wherein the detection timing of the voltage abnormality is set to synchronize with a rising or falling edge of a control signal for driving the driver.

4. The load controller according to claim 1, wherein the first current source controller is set to operate according to a voltage detection signal between the electromagnetic load and the switching element.

5. The load controller according to claim 1, further comprising:

delaying means for delaying a drive signal that is input to a gate of the driver by a given period of time from a control signal of a microcomputer;

wherein a delay range of the given period is set as time range for detecting the voltage abnormality.

6. The load controller according to claim 5 further comprising:

means for confirming a voltage abnormality by determining whether or not an abnormal voltage value that is detected in a time zone continues for a given period of time or longer.

7. The load controller according to claim 1, further comprising means for confirming a voltage abnormality by determining whether or not a control signal of the switching element remains off when an abnormal voltage value is detected.

8. The load controller according to claim 1, wherein the diagnosing means detects a voltage abnormality caused by at least one of i) a battery short in a circuit for the electromagnetic load, ii) a ground short in said circuit, iii) a breakdown of a regeneration diode that regenerates the counter electromotive energy at the time of the interruption of the electromagnetic load, and iv) an open state of the regeneration diode.

9. The load controller according to claim 1, wherein:

a circuit for the electromagnetic load includes a regeneration diode that regenerates the counter electromotive energy upon interruption of the electromagnetic load; and the diagnosing means comprises means for determining whether or not a current flows in the regeneration diode when the voltage abnormality is detected.

10. The load controller according to claim 1, wherein:

a circuit for the electromagnetic load includes a regeneration diode that regenerates the counter electromotive energy upon interruption of the electromagnetic load;

the diagnosing means detects a voltage abnormality caused by a breakdown or an open state of the regeneration diode; and the load controller further comprises means for confirming the voltage abnormality by determining whether or not a control signal of the switching element remains off when an abnormal voltage value is detected.

11. The load controller according to claim 9, wherein the diagnosing means that detects a voltage abnormality caused by the breakdown or the open state of the regeneration diode comprises:

a clamper that clamps the voltage abnormality when the abnormality voltage value exceeds a given threshold, and turns on a gate of the driver of the electromagnetic load; and a detector that detects a gate potential when the switching element is energized by clamping of the voltage abnormality.

* * * * *